(12) United States Patent
Abe

(10) Patent No.: US 6,903,008 B2
(45) Date of Patent: Jun. 7, 2005

(54) METHOD FOR FORMING AN INTERCONNECTION IN A SEMICONDUCTOR ELEMENT

(75) Inventor: Kazuhide Abe, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 144 days.

(21) Appl. No.: 10/320,582

(22) Filed: Dec. 17, 2002

(65) Prior Publication Data

US 2003/0087490 A1 May 8, 2003

Related U.S. Application Data

(63) Continuation of application No. 09/609,930, filed on Jul. 5, 2000, now Pat. No. 6,514,848, and a continuation of application No. 09/346,943, filed on Jul. 2, 1999, now Pat. No. 6,103,618.

(30) Foreign Application Priority Data

Jul. 7, 1998 (JP) .......................................... 10-191465

(51) Int. Cl.[7] .......................................... H01L 21/4763
(52) U.S. Cl. ....................................... 438/637; 438/687
(58) Field of Search ................................ 438/637, 626, 438/627, 631, 632, 633, 618, 639, 643, 644, 645, 648, 656, 660, 680, 712, 692, 697, 687, 688

(56) References Cited

U.S. PATENT DOCUMENTS

| 5,424,246 | A | * | 6/1995 | Matsuo et al. ............... 438/642 |
| 5,449,641 | A | | 9/1995 | Maeda |
| 5,527,739 | A | * | 6/1996 | Parrillo et al. ............... 438/637 |
| 5,534,463 | A | | 7/1996 | Lee et al. |
| 5,581,125 | A | | 12/1996 | Maeda |
| 5,665,659 | A | | 9/1997 | Lee et al. |
| 5,723,382 | A | | 3/1998 | Sandhu et al. |
| 5,843,837 | A | | 12/1998 | Baek et al. |
| 5,953,634 | A | * | 9/1999 | Kajita et al. ................. 438/687 |
| 6,087,257 | A | | 7/2000 | Park et al. |
| 6,103,618 | A | * | 8/2000 | Abe ........................... 438/637 |
| 6,235,071 | B1 | | 5/2001 | Tsuchiya et al. |
| 6,260,266 | B1 | * | 7/2001 | Tamaki ........................ 29/852 |

FOREIGN PATENT DOCUMENTS

JP 5-190548 7/1993

* cited by examiner

*Primary Examiner*—David Nhu
(74) *Attorney, Agent, or Firm*—Volentine Francos, PLLC

(57) ABSTRACT

There is disclosed a method for forming an interconnection in the semiconductor element, including a process for forming a groove 117 on an underlying substrate so as to correspond to the designed pattern, a process for forming an underlayer to improve crystalline of an interconnection which will be formed in the succeeding stage on said underlying substrate with said groove, a process for forming a thin film of the interconnection material, a heat-treatment process to fill the said groove with the thin film of the interconnection material formed on the underlying substrate, and a process for forming the interconnection by polishing the surface of the thin film by predetermined quantity.

8 Claims, 9 Drawing Sheets

METHOD FOR FORMING AN INTERCONNECTION IN A SEMICONDUCTOR ELEMENT

CROSS-REFERENCE TO RELATED APPLICATIONS

This claims priority to and is a continuation of Ser. No. 09/609,930, filed Jul. 5, 2000, now U.S. Pat. No. 6,514,848, which in turn claims priority to and is a continuation of Ser. No. 09/346,943, filed Jul. 2, 1999, and now U.S. Pat. No. 6,103,618.

BACKGROUND OF THE INVENTION

The present invention relates to the method for forming an interconnection in the semiconductor element.

Increasing attention is paid to Cu which is regarded as the next generation interconnection material in the place of the Al interconnection. The reason for this is that Cu has an excellent electromigration (EM) tolerance as well as small resistance of 1.69 micro ohm cm. However, increase in the current density with downsizing interconnections to microstructure requires the reinforcement of Cu to secure high reliability. One way to make the Cu film highly immune to electromigration is to improve crystalline of the Cu film. Therefore, the use of the underlayer texture of TiN film with strong TiN (111) orientation is effective. This is because Cu (111) crystallographic orientation is enhanced on TiN film having strong TiN (111) orientation. (reference document: Extend Abstracts of the 1997 International Conference On Solid State Devices and Materials 1997 pp 298–299)

Of late years, the chemical mechanical polishing (CMP) technology introduced for flattening the insulator film begins to be used for forming the Cu interconnections by the Damascene method. Forming an interconnection by the damascene method solves the problem that minute forming of an interconnection by reactive ion etching (RIE) is difficult in case of Cu. In addition, it is advantageous in that the strong coatability of an interlayer film to the step construction is not necessarily indispensable.

However, unlike the formation of an interconnection by the conventional reactive ion etching processing, it is considered that an interconnection formed by the damascene method is influenced by the crystal of the underlying film at the sidewall of the Cu interconnection as well as at the bottom surface thereof. For example, the Cu grain was classified into two. One which faces the sidewalls is classified as the edge region, whereas the other part is classified as the central region. Then, the Cu grain orientation of each region is analyzed. The width of the interconnection of the analytical object is 5 micrometers, and the average grain size of Cu is 0.9 micrometers.

The result of the analysis shows that Cu grains of Cu (111) orientation are decreased in the edge region compared with the central region. This supports the above-mentioned remark. Moreover, it is also well known that narrower width of the interconnection reduces the effect of improvement of a crystalline property of the Cu film obtained by using said underlying film.

SUMMARY OF THE INVENTION

The object of the present invention has aimed to provide the method for the forming an interconnection in the semiconductor element highly immune to the electromigration by solving the above-mentioned problem, and controlling influence from the underlying film on the minute damascene Cu interconnection in the aspect of crystal.

To achieve the above-mentioned object:

According to the present invention, there is provided a method for forming an interconnection in the semiconductor element, including a process for forming a groove on an underlying substrate so as to correspond to the designed pattern, a process for forming an underlayer to improve crystalline of an interconnection which will be formed in the succeeding stage on said underlying substrate with said groove, a process for forming a thin film of the interconnection material, a heat-treatment process to fill the said groove with the thin film of the interconnection material formed on the underlying substrate, and a process for forming the interconnection by polishing the surface of the thin film processed by the heat treatment by predetermined quantity.

In addition, according to the present invention, there is also provided a method for forming an interconnection in the semiconductor element, including a process for forming a groove on an underlying substrate so as to correspond to the designed pattern, a process for forming an underlayer to improve crystalline properties of interconnection which will be formed in the succeeding stage on said underlying substrate with said groove, a process for forming an underlayer with an insulator film or an underlayer which does not improve the crystalline properties of the interconnection which will be formed in the succeeding stage, a process for forming an underlayer by etching back on the sidewalls of said groove with an insulator film or an underlayer which does not improve the crystalline properties of the interconnection which will be formed in the succeeding stage, a process for forming a thin film of the, interconnection material, a heat-treatment process to fill the said groove with the thin film of the interconnection material formed on the underlying substrate, and a process for forming the interconnection by polishing the surface of the thin film processed by the heat treatment by the predetermined quantity.

Further, according to the present invention, there is also provided a method for forming an interconnection in the semiconductor element, including a process for forming a groove on underlying substrate so as to correspond to the designed pattern, a process for forming an underlayer to improve crystalline properties of the interconnection which will be formed in the succeeding stage on said underlying substrate with said groove, a process in which said underlayer is made amorphous, a process for removing said amorphous underlayer except the same that is formed on the sidewalls of said groove, a process for forming a thin film of the interconnection material, a heat-treatment process to fill the said groove with the thin film of the interconnection material formed on the underlying substrate, and a process for forming the interconnection by polishing the surface of the thin film processed by the heat treatment by the predetermined quantity.

Further, according to the present invention, there is also provided a method for forming an interconnection in the semiconductor element, including a process for forming a groove on an underlying substrate so as to correspond to the designed pattern, a process for forming an underlayer to improve crystalline properties of interconnection which will be formed in the succeeding stage on said underlying substrate with said groove, a process for forming a resist or an insulator film, a process for preserving said resist or said insulator film in the groove by etching back, a process in which said underlayer is removed except the same on the bottom surface of the groove, a process for removing the resist or the insulator film in said groove, a process for forming a thin film of the interconnection material, a heat-treatment process to fill the said groove with the thin film of the interconnection material formed on the underlying substrate, and a process for forming the interconnection by polishing the surface of the thin film processed by the heat treatment by predetermined quantity.

Still, further, according to the present invention, there is also provided a method for forming an interconnection in the semiconductor element, including a process for patterning an underlayer which improves crystalline of an interconnection which will be formed in the succeeding stage on an underlying substrate, a process for forming a groove on an underlying substrate so as to correspond to the designed pattern as well as to said underlayer, a process for forming a thin film of the interconnection material, a heat-treatment process to fill the said groove with the thin film of the interconnection material formed on the underlying substrate, and a process for forming the interconnection by polishing the surface of the thin film by the predetermined quantity.

In the above-mentioned method for forming an interconnection in the semiconductor element, at least any one of a multi-layer film of TiN and Ti or a TiN film is used as an underlayer to improve crystalline of said interconnection.

In the above-mentioned method for forming an interconnection in the semiconductor element, at least any one of W, Mo or Ta is used as an underlayer which does not improve crystalline of said interconnection.

In the above-mentioned method for forming an interconnection in the semiconductor element, the material of said interconnection is copper or the copper alloy, or aluminum or an aluminum alloy.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENTS OF THE INVENTION

The following is a detailed explanation of the preferred embodiments of a method for forming an interconnection in the semiconductor element according to the present invention.

FIG. 1 is a sectional view explaining the process for forming an wiring for the semiconductor element according to the first embodiment of the present invention.

Figure 1A:
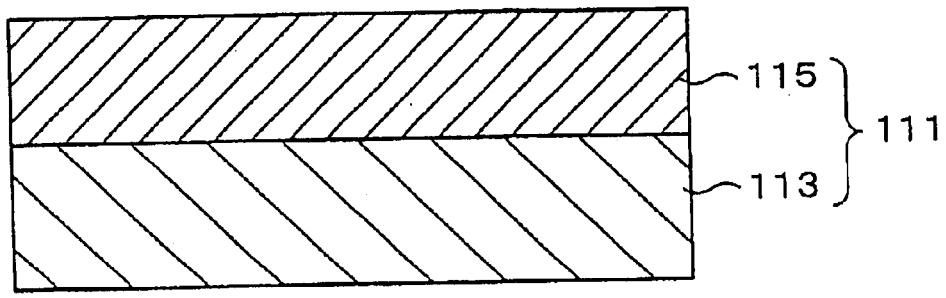
FIG. 1 is a sectional view explaining the process of forming an interconnection in the semiconductor element according to the first embodiment of the present invention.

First, as shown in FIG. 1(A), a semiconductor substrate 113 with an interlayer insulator film 115 formed thereon is used as an underlying substrate 111 on which a wiring construction is to be formed.

Figure 1B:
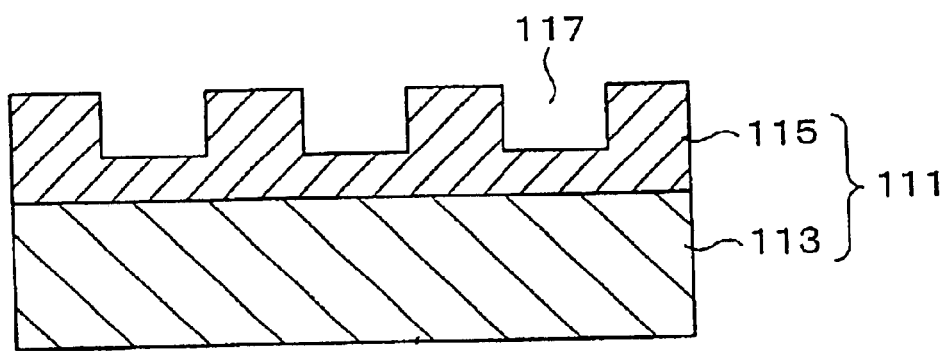

Next, the predetermined quantity of the interlayer insulator film 115 is polished by the CMP method as shown in FIG. 1(B) for a global flattening of a periphery part and a cell part. Afterwards, a groove 117 is formed with the publicly known lithography technology and the etching technology so as to be positioned corresponding to the designed pattern.

Figure 1C:
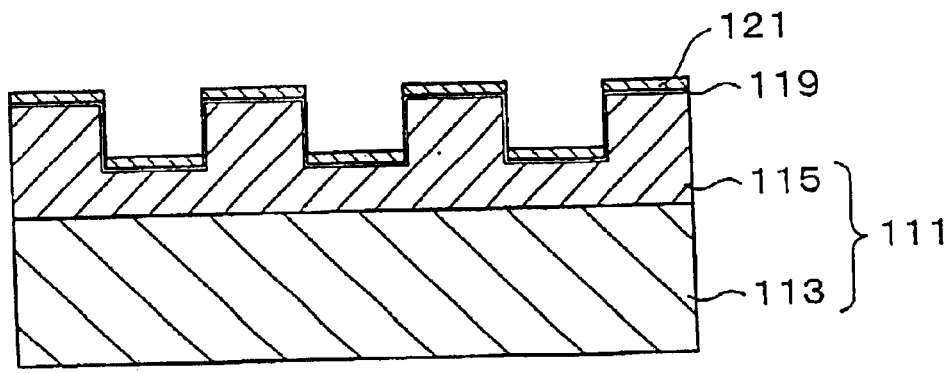

Next, as shown in FIG. 1(C), as an underlying texture to improve crystalline properties of Cu, in this embodiment, a Ti film 119 with the thickness of 100 angstroms and a TiN film 121 with the thickness of 400 angstroms are formed sequentially in the vacuum by the IMP (Ion Metal Plasma) sputtering, a collimate sputtering or a long slow sputtering, in which the directivity is improved.

For instance, the Ti film 119 is formed in discharging the Ar gas by the IMP sputtering under the condition with the DC power of 3–5 kW, the radio frequency power of 2–4 kW and the deposition pressure of 10–50 mTorr. On the other hand, the TiN film 121 is formed in discharging the $N_2$ gas by the IMP sputtering under the condition with the DC power of 4–8 kW, the radio frequency power of 1.5–4 kW and the deposition pressure 25–40 mTorr. At this stage, the Ti film 119 and the TiN film 121 are prevented from piling up on the sidewall of the groove by the sputtering method with improved directivity.

Figure 1D:
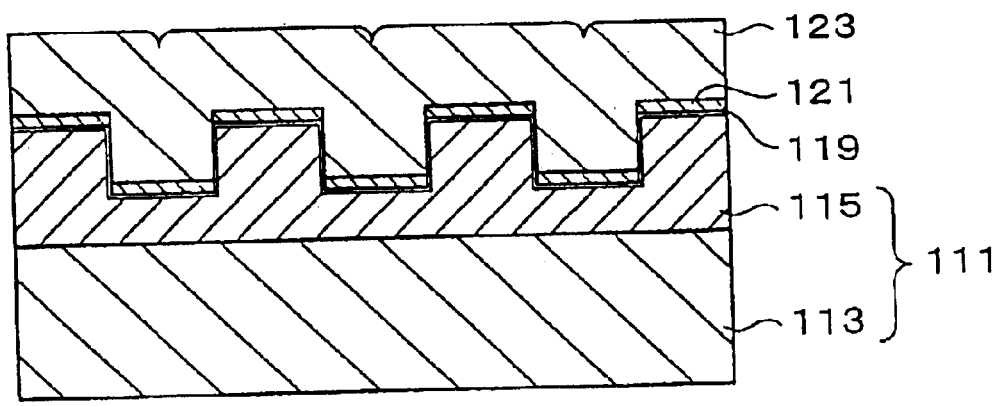

Next, as shown in FIG. 1(D), as a thin film, a Cu film 123 with the thickness of 7000 angstroms is piled up by the sputtering method. The sputtering method is executed under the condition with the power of 8 kW and the Ar pressures of 0.8 mTorr. After the Cu film 123 is deposited on the underlying texture, a heat treatment is performed to the object in the same chamber under a high vacuum circumstance (in this embodiment, vacuum of about $10^{-10}$ Torr). As a result, Cu can be filled in the groove 117, as Cu re-flows by this heat-treating.

Figure 1E:
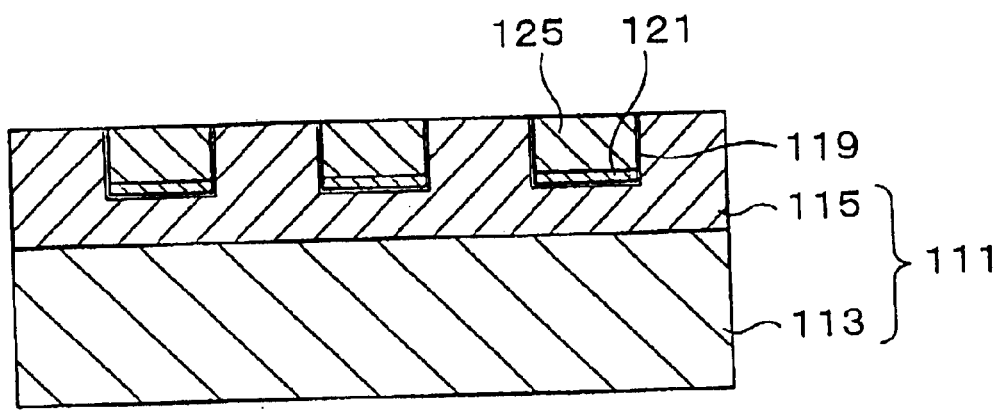

Next, the Cu film and the TiN film positioned other than in the groove are removed by the chemical machine polishing method (CMP) as shown in FIG. 1(E). The slurry including $Al_2O_3$ is used here. The slurry is mixed with $H_2O_2$ at a rate of 3:1. The down force of the carrier is 3 psi (pound square inch). Both the carrier and the table speeds are assumed to be 30 rpm. When the removal of the unnecessary Cu film and TiN film completes, the desired Cu interconnection 125 is formed.

In this embodiment, the TiN/Ti multi-layer film is used as an underlying texture to improve crystalline of Cu. However, the direct nitride film of Ti (for instance, formed by heat-treating the Ti film in the $N_2$ atmosphere at 760 degrees C. for 30 seconds) can be also applied. Moreover, though Cu is used for a material of an interconnection in this embodiment, aluminum or aluminum alloy can also be used.

According to the present invention, by forming the underlying film of which directivity is improved, the film thickness of the underlying film of Cu at the sidewall in the groove is made ultra thin. Therefore, the influence on the Cu grains facing the sidewalls of the groove from the crystal in the underlayer on the sidewalls can be prevented. As a result, the damascene Cu interconnection can be made highly immune to electromigration, mainly because crystalline property of Cu is improved because of the underlying film of the groove's bottom surface. In addition, the number of processes of the first invention is the fewest compared with those of the following embodiments.

Next, the second embodiment of the present invention is explained.

FIG. 2 is a sectional view explaining process of forming an interconnection in the semiconductor element according to the second embodiment of the present invention.

Figure 2A:
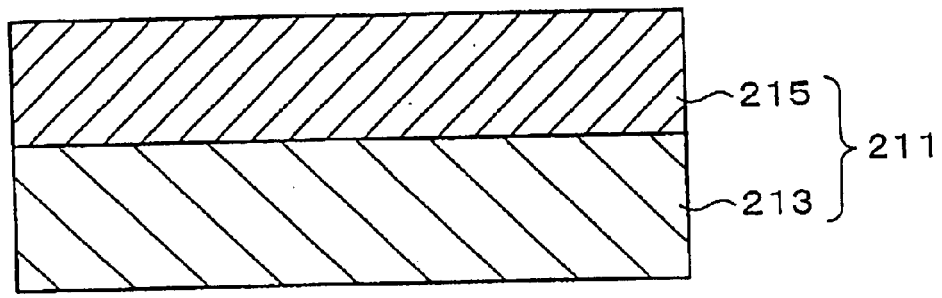
FIG. 2 is a sectional view explaining the process of forming an interconnection in the semiconductor element according to the second embodiment of the present invention.

First, as shown in FIG. 2(A), a semiconductor substrate 213 with an interlayer insulator film 215 formed thereon is used as an underlying substrate 211 on which an interconnection is to be formed.

Figure 2B:
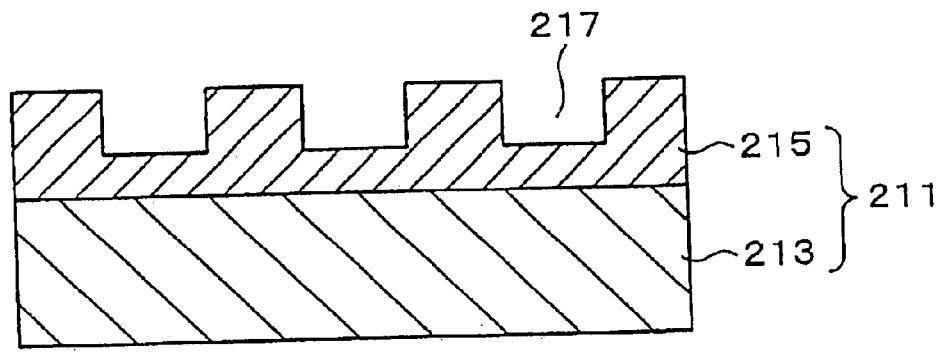

Next, the predetermined quantity of the interlayer insulator film 215 is polished by the CMP method as shown in FIG. 2(B) for a global flattening of the periphery part and the cell part. Afterwards, a groove 217 is formed by the publicly known lithography technology and the etching technology so as to be positioned corresponding to the designed pattern.

Figure 2C:
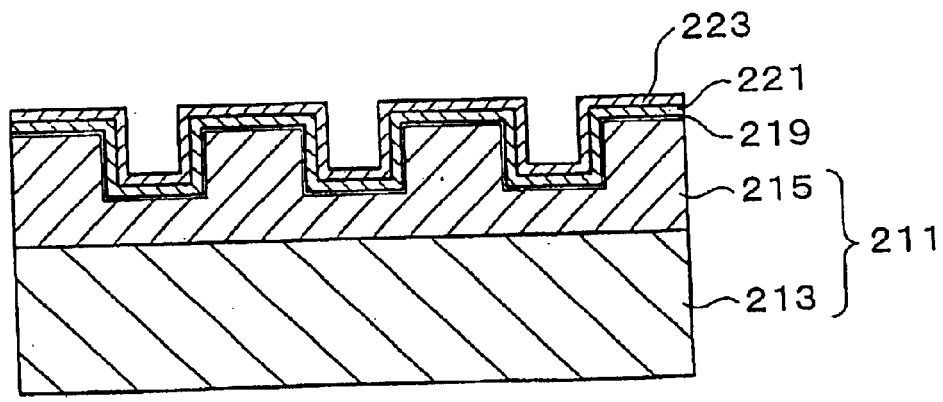

Next, as shown in FIG. 2(C), as an underlying texture to improve crystalline properties of Cu, a Ti film 219 with the thickness of 100 angstroms and a TiN film 221 with the thickness of 400 angstroms are formed sequentially in the vacuum by the sputtering method. For instance, the Ti film 219 is formed in discharging the Ar gas under the condition with the power of 1 kW, the deposition pressure of 2 mTorr, whereas the TiN film 221 is formed in discharging the $N_2$ gas under the condition with the power of 5 kW, the deposition pressure of 9 mTorr. Next, a SiN film 223 is formed by the Chemical Vapor Deposition (CVD) method.

In this embodiment, the SiN film 223 with the thickness of 500 angstroms is piled up by using $SiH_4$, $NH_3$ and $N_2$ gases under the condition with the temperature of 420 degrees C., the chamber pressure of 4 Torr and the radio frequency power of 500 W.

Figure 2D:
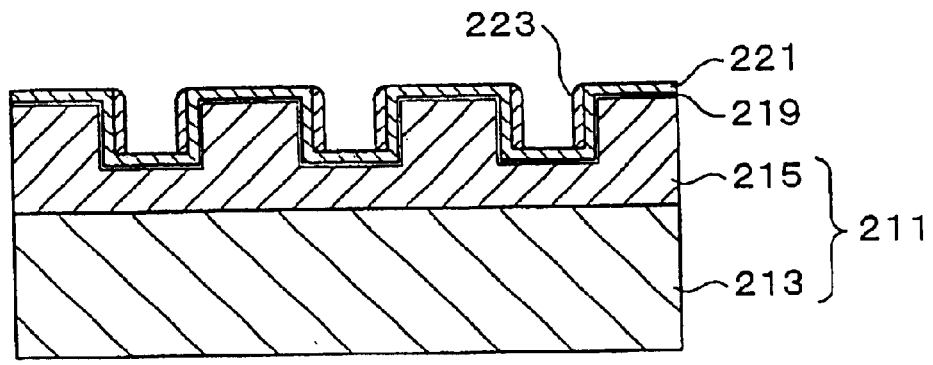

Next, as shown in FIG. 2(D), the SiN film 223 positioned other than in the groove is removed by the aeolotropic etching. In this embodiment, etching is executed under the condition with the radio frequency power of 1300 W and the chamber pressure of 40 mTorr by using the $CHF_3$ and the CO gases.

Figure 2E:
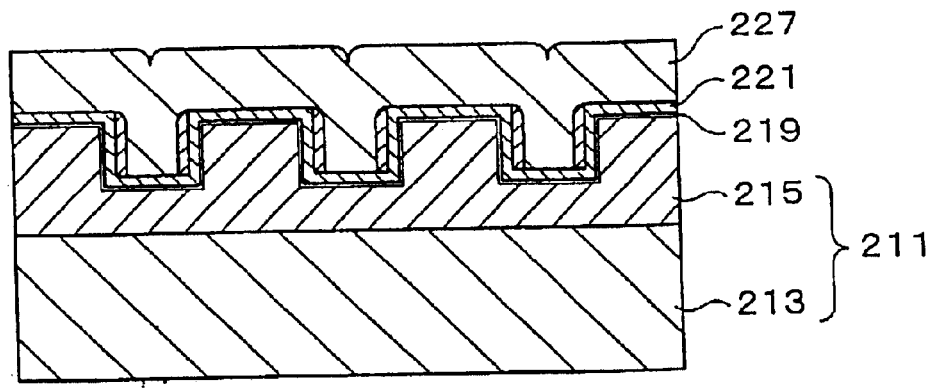

Next, as a thin film, a Cu film 227 with the film thickness of 7000 angstroms is piled up by the sputtering method as shown in FIG. 2(E). Here, sputtering is executed under the condition with the power of 8 kW and the Ar pressure of 0.8 mTorr. After the Cu film 123 is deposited on the underlying texture, a heat treatment is performed to the object in the same chamber under a high vacuum circumstance (in this embodiment, vacuum of about $10^{-10}$ Torr), Cu can be filled in the groove 217, because Cu re-flows.

Figure 2F:
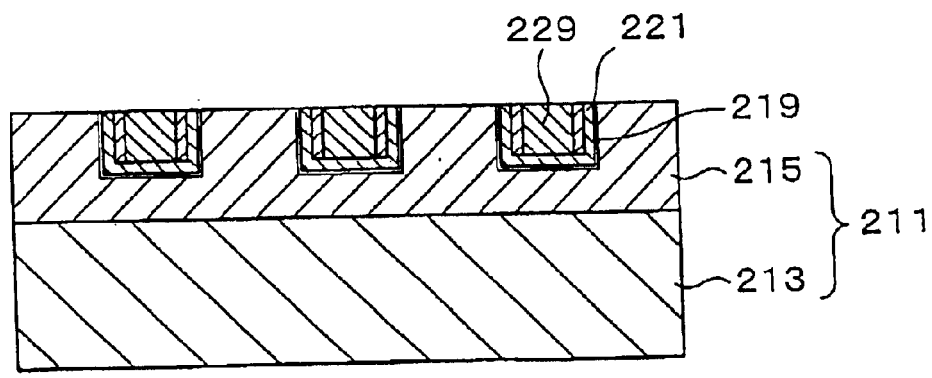

Next, the Cu film 227, the SiN film 223, the TiN film 221, and the Ti film 219 positioned other than in the groove are removed by the chemical machine polishing (CMP) method as shown in FIG. 2(F). The slurry including $Al_2O_3$ is mixed with $H_2O_2$ at a rate of 3:1. The down force of the carrier is 3 psi. Both the carrier and the table speeds are assumed to be 30 rpm. When removal of the unnecessary Cu film 227 and the SiN film 223, the TiN film 221, and the Ti film 219 completes, the desired Cu interconnection 229 is formed.

According to this embodiment, since the Cu interconnection 229 comes in contact only with the underlying film of the groove's bottom surface, information concerning crystals from the groove's bottom surface can be communicated to the Cu interconnection 229. Therefore, the influence on the Cu grains facing the groove's sidewall from the crystals in the underlayer on sidewall can be prevented. With this, the damascene Cu interconnection can be made highly immune to electromigration.

Next, the third embodiment of the present invention is explained.

FIG. 3 is a sectional view explaining process of forming an interconnection in the semiconductor element according to the third embodiment of the present invention.

Figure 3A:
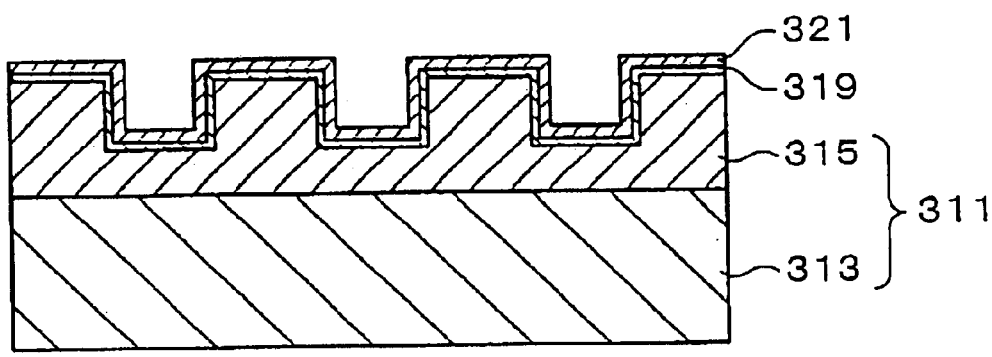
FIG. 3 is a sectional view explaining the process of forming an interconnection in the semiconductor element according to the third embodiment of the present invention.

After passing through the same processes described in the second embodiment shown in FIG. 2(A) and (B) (The detailed explanation is omitted), as shown in FIG. 3(A), as an underlying texture to improve crystalline of Cu, a Ti film 319 with the thickness of 100 angstroms and a TiN film 321 with the thickness of 400 angstroms are formed sequentially in the vacuum by the sputtering method. It is to be noted that a semiconductor substrate 313 with an interlayer insulator film 315 formed thereon is used as an underlying substrate 311 on which an interconnection is to be formed.

Figure 3B:
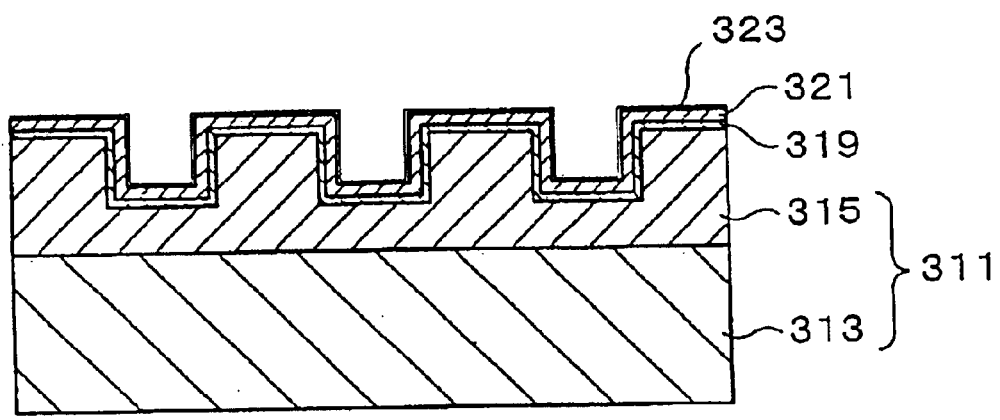

Next, as shown in FIG. 3(B), by injecting B ion under the condition with, for instance, the accelerating voltage 10 keV and the dose quantity of $1 \times 10^{15} cm^{-2}$, the uppermost surface layer of the TiN/Ti multi-layer film is made amorphous, thereby forming an amorphous layer 323.

At this time, the surface layer of the TiN/Ti multi-layer film can be amorphouslized by the Ar sputtering.

Figure 3C:
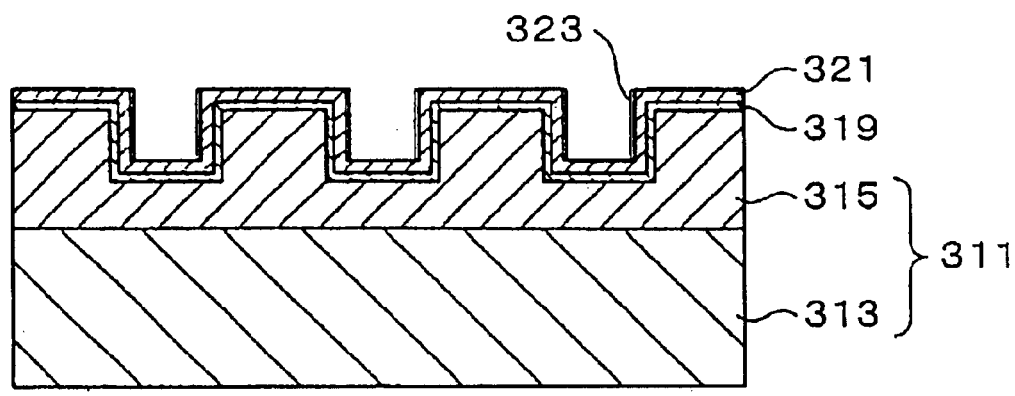

Next, after amorphouslization of the Cu underlying layer, the amorphous layer formed other than at the sidewalls in the groove is removed by aeolotropic etching as shown in FIG. 3(C). For instance, etching is executed under the condition with the radio frequency power of 70 W, the microwaves of 400 mA and the chamber pressure of 5 mTorr, in introducing the $BCl_3$ and the $Cl_2$ gases.

Figure 3D:
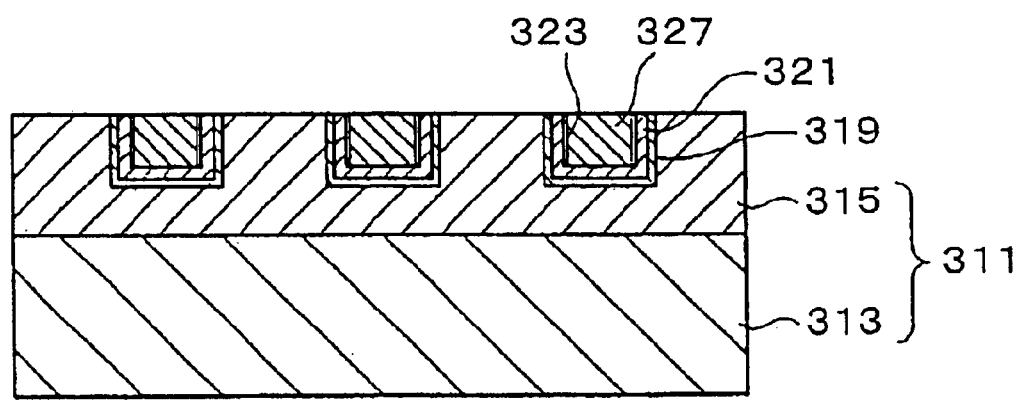

Next, as shown in FIG. 3(D), a desired Cu interconnection 327 is formed by executing the same processes as shown in FIG. 2(E) and its succeeding figures.

According to this embodiment, the crystalline property of the underlayer of Cu is changed is quality by the ion implantation or the AR sputtering. Therefore, the influence on Cu grains facing the groove's sidewall from the crystal in the underlayer of sidewall can be prevented so that the number of the processes can be reduced compared with the second embodiment. Further, according to third embodiment, in addition that the damascene Cu interconnection is made highly immune to electromigration, as the sectional area of Cu with small resistance is made larger compared with that disclosed in the second embodiment, the resistance of the interconnection can be reduced. In a word, the thickness of the underlayer is substantially a thickness of the TiN/Ti multi-layer film, because the plane surface of the TIN film is made amorphous.

Next, the fourth embodiment of the present invention is explained.

FIG. 4 is a sectional view explaining process of forming an interconnection in the semiconductor element according to the fourth embodiment of the present invention.

Figure 4A:
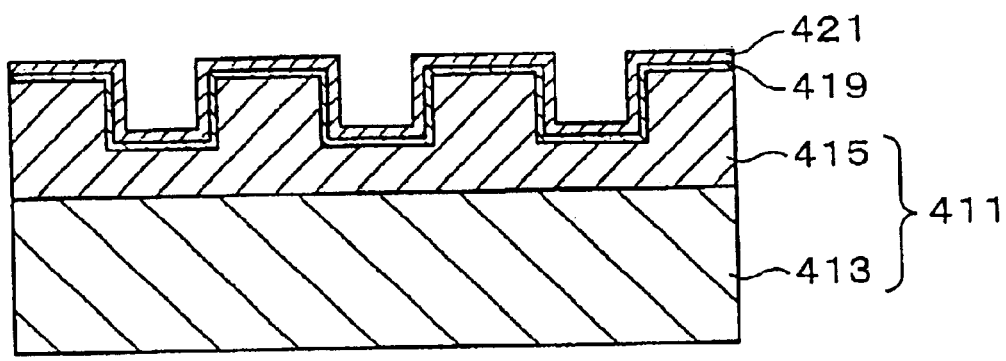
FIG. 4 is a sectional view explaining the process of forming an interconnection in the semiconductor element according to the fourth embodiment of the present invention.

After passing through the same processes described in the second embodiment shown in FIG. 2(A) and (B), (The explanation is omitted), as shown in FIG. 4(A), as an underlying texture to improve crystalline properties of Cu, a Ti film 419 with the thickness of 100 angstroms and a TiN film 421 with the thickness of 400 angstroms are formed sequentially in the vacuum by the sputtering method. It is to be noted that a semiconductor substrate 413 with an interlayer insulator film 415 formed thereon is used as an underlying substrate 411 on which an interconnection is to be formed.

Figure 4B:
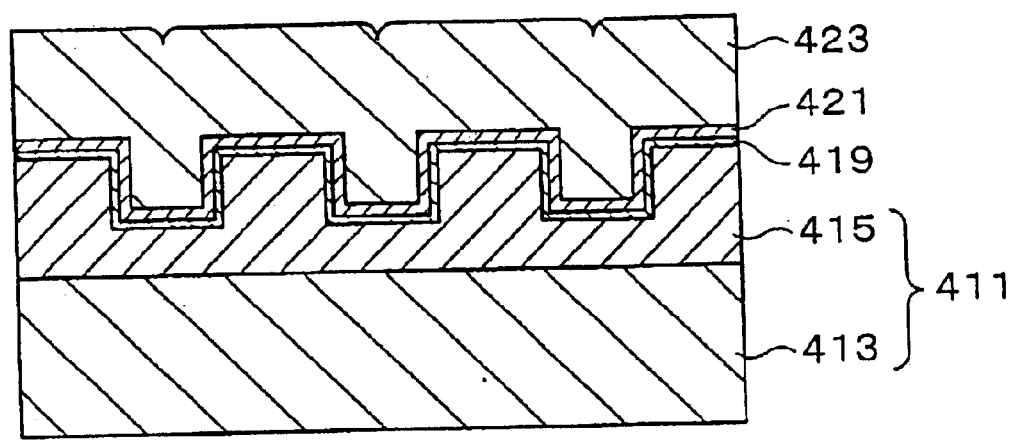

Next, the surface of the TiN film 421 is coated with a resist 423 as shown in FIG. 4(B).

Figure 4C:
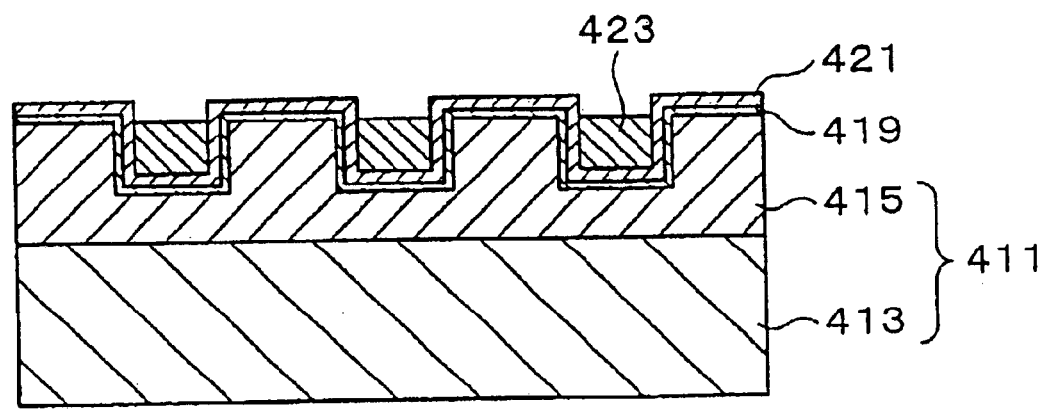

Then, as shown in FIG. 4(C), the resist 423 in the area other than in the groove is etched back, the resist 423 remains thereby in the groove.

Figure 4D:
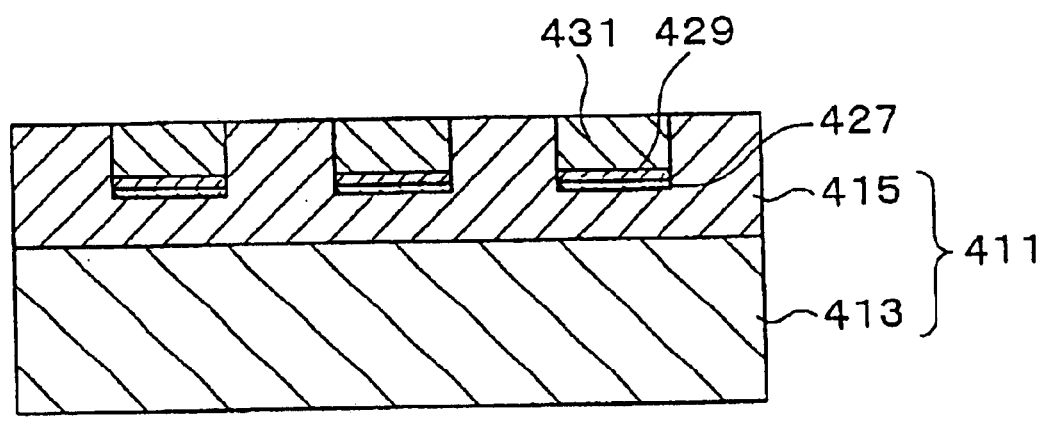

Next, the TiN/Ti multi-layer film formed outside the groove and on the sidewalls of the groove are removed by neolotropic etching as shown in FIG. 4(D). For instance, etching is executed under the condition with the radio frequency power of 80 W, the microwaves of 300 mA and the chamber pressure of 10 mTorr, in introducing the 100% $Cl_2$ gas. At this time, the etching rate of Resist:TiN is about 1:2. After removing the resist in the groove by the ashing treatment, a desired Cu interconnection 431 is formed by executing the same processes as shown in FIG. 2(E) and its succeeding figures. The Ti film 427 and the TiN film 429 are left in the bottom of the Cu interconnection 431.

According to the fourth embodiment of the invention, in addition that the damascene Cu interconnection is made highly immune to electromigration, the sectional area of Cu can be made larger by removing the underlying film of Cu at the sidewalls of the groove. Consequently, compared with the first through third embodiments, the resistance of the interconnection can be reduced.

Next, the fifth embodiment of the present invention is explained.

FIG. 5 is a sectional view explaining process of forming an interconnection in the semiconductor element according to the fifth embodiment of the present invention.

Figure 5A:
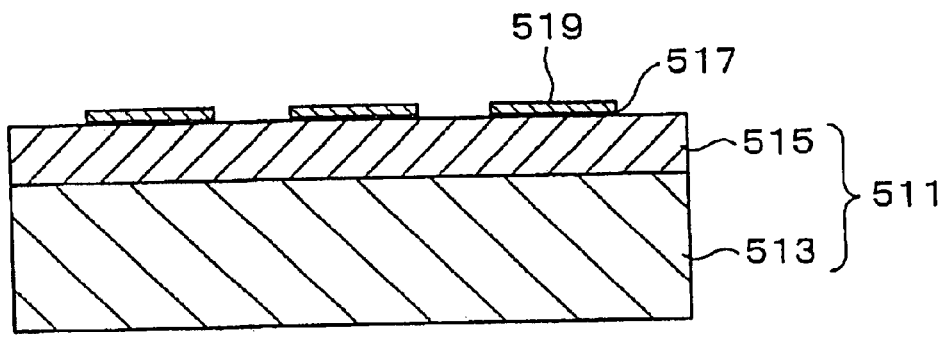
FIG. 5 is a sectional view explaining the process of forming an interconnection in the semiconductor element according to the fifth embodiment of the present invention.

After passing through the same processes described in the second embodiment shown in FIG. 2(A) (the detailed explanation is omitted), the interlayer insulator film is polished by CMP method. Then, as shown in FIG. 5(A), as an underlying texture to improve crystalline properties of Cu, a Ti film 517 and a TiN film 519 are formed sequentially in the vacuum by the sputtering method. The film thickness of the Ti film 517 and the TiN film 519 is 100 angstroms and 400 angstroms, respectively. The Ti film 517 and the TiN film 519 are patterned by the publicly known lithography technology and the etching technology. In this embodiment, a semiconductor substrate 513 with an interlayer insulator film 515 formed thereon is used as an underlying substrate 511 on which an interconnection is to be formed.

Figure 5B:
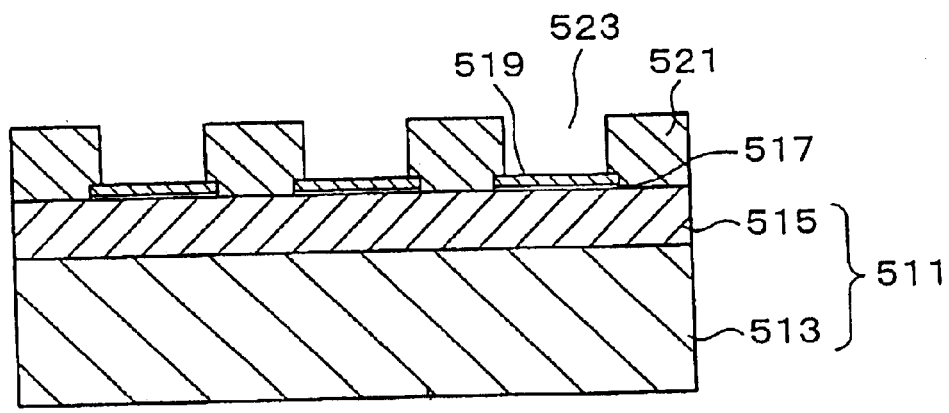

Next, as shown in FIG. 5(B), an interlayer insulator film 521 is formed, and a groove 523 is formed in accordance with the designed pattern. At this stage, the patterned TiN film 519 is exposed at the bottom surface of the groove 523.

Figure 5C:
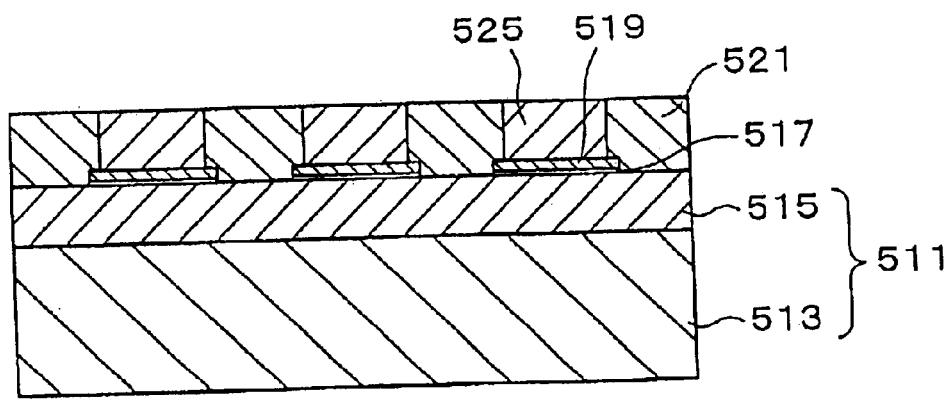

Next, as shown in FIG. 5(C), a desired Cu interconnection 525 is formed by executing the same processes as shown in FIG. 2(E) and its succeeding figures.

According to this embodiment, as the underlying film of Cu is patterned in advance, the groove can be filled only with Cu. For this reason, the sectional area of the Cu interconnection is largest in that of the first to fourth embodiments so that, according to this embodiment, the interconnection resistance can be reduced still further.

In addition, the crystalline property of Cu receives influence only from the underlying film in the groove's bottom surface. Therefore, the damascene Cu interconnection can be made highly immune to electromigration. Still further, unlike the first and the second embodiments, the underlayer of Cu is not formed in the groove 523. Therefore, a crystalline property of damascene Cu interconnection can be further improved by increasing the thickness of the underlayer.

Some preferred examples of the method for forming a wiring in the semiconductor embodying the invention have been described hereinabove with reference to the accompanying drawings, but it should be noted that the invention is not limited to those disclosed embodiments. It should be apparent to those skilled in the art that various changes or modifications may be made without departing from the technical thought as recited in the scope of claims for patent as attached hereto. Therefore, those changes and modifications should naturally fall in the scope of the technical thought of the invention.

The following effects are achieved according to the present invention.

According to the present invention, by forming an underlying film in which the directivity is improved, the thickness of the underlying film of the interconnection at the sidewall in the groove is made ultra thin. Therefore, the influence on the grains of the interconnection facing the sidewalls of the groove from the crystal in the underlayer on the sidewalls can be prevented. As a result, the damascene interconnection can be made highly immune to electromigration, mainly because the crystalline property of the interconnection is improved because of the underlying film of the groove's bottom surface.

According to the present invention, since the interconnection comes in contact only with the underlying film of the groove's bottom surface, information concerning crystals from the groove's bottom surface can be communicated to the interconnection. Therefore, the influence on the grains of the interconnection facing the groove's sidewall from the crystals in the underlayer on sidewall can be prevented. With this, the damascene interconnection can be made highly immune to electromigration.

According to the present invention, crystalline properties of the underlayer of the interconnection is changed in quality by the ion implantation or the AR sputtering. Therefore, the influence on grains of the interconnection facing the groove's sidewall from the crystal in the underlayer on sidewall can be prevented so that the number of the processes can be reduced compared with the second embodiment. Further, in addition that the damascene interconnection is made highly immune to electromigration, as the sectional area of Cu with small resistance is made larger compared with the second embodiment, the resistance of the interconnection can be made smaller.

According to the present invention, in addition that the damascene interconnection is made highly immune to electromigration, the sectional area of the interconnection can be made larger by removing the underlying film of the interconnection at the sidewalls of the groove. Consequently, compared with the first through third embodiments, the resistance of the interconnection is smaller.

According to the present invention, as the underlying film of the interconnection is patterned in advance, the groove can be filled only with the interconnection. For this reason, the sectional area of the interconnection is largest comparing with those in first through four embodiments so that the interconnection resistance can be reduced still further.

While preferred embodiments of the method for forming an interconnection in the semiconductor element according to the present invention have been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

The entire disclosure of Japanese Patent Application No. 10-191465 filed on Jul. 7, 1998 including specification, claims, drawings and summary is incorporated herein by reference in its entirety.

What is claimed is:

1. A method for forming a semiconductor element, comprising:

forming a groove having a bottom wall and side walls in a surface of an insulating film;

sequentially forming a first layer and a second layer over the surface of the insulating film and over the bottom wall and side walls of the groove in a first chamber, wherein the first layer is made of a high melting-point metal and the second layer is made of a nitride of the high melting-point metal, wherein a thickness of the first layer is formed to be thinner than a thickness of the second layer, wherein a combined thickness of the first and second layers formed over the side walls of the groove is thinner than a combined thickness of the first and second layers formed over the surface of the insulating film, and wherein the combined thickness of the first and second layers formed over the side walls of the groove is thinner than a combined thickness of the first and second layers formed over the bottom wall of the groove;

forming a conductive layer over the surface of the insulating film and within the groove in a second chamber, wherein the conductive layer includes copper, and wherein the first and second layers are interposed between the conductive layer and the insulating film; and chemically and/or mechanically polishing the conductive layer to remove the conductive layer formed over the surface of the insulating film.

2. The method as claimed in claim 1, wherein said polishing further removes the first and second layers over the surface of the insulating film.

3. The method as claimed in claim 1, wherein the high melting-point metal is titanium.

4. The method as claimed in claim 2, wherein the high melting-point is titanium.

5. The method as claimed in claim 1, wherein the first and second layers are formed by respective first and second sputtering processes.

6. The method as claimed in claim 5, wherein the second layer is formed by discharging a nitride gas during the second sputtering process.

7. The method as claimed in claim 1, wherein the first and second layers are formed by respective first and second ion metal plasma sputtering processes.

8. The method as claimed in claim 7, wherein the second layer is formed by discharging a nitride gas during the second ion metal plasma sputtering process.

* * * * *